US011053600B2

(12) United States Patent
Tatsumi

(10) Patent No.: US 11,053,600 B2
(45) Date of Patent: Jul. 6, 2021

(54) TIN OR TIN ALLOY PLATING SOLUTION AND BUMP FORMING METHOD

(71) Applicant: MITSUBISHI MATERIALS CORPORATION, Tokyo (JP)

(72) Inventor: Koji Tatsumi, Sanda (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 16/768,921

(22) PCT Filed: Mar. 19, 2019

(86) PCT No.: PCT/JP2019/011349
§ 371 (c)(1),
(2) Date: Jun. 2, 2020

(87) PCT Pub. No.: WO2019/181906
PCT Pub. Date: Sep. 26, 2019

(65) Prior Publication Data
US 2021/0025069 A1 Jan. 28, 2021

(30) Foreign Application Priority Data

Mar. 20, 2018 (JP) .............................. JP2018-052012
Mar. 26, 2018 (JP) .............................. JP2018-057551
Mar. 6, 2019 (JP) .............................. JP2019-040216

(51) Int. Cl.
*C25D 3/32* (2006.01)
*C25D 3/60* (2006.01)
(Continued)

(52) U.S. Cl.
CPC ................. *C25D 3/32* (2013.01); *C25D 3/60* (2013.01); *C25D 5/505* (2013.01); *C25D 7/12* (2013.01);
(Continued)

(58) Field of Classification Search
CPC ............... C25D 3/30; C25D 3/56; C25D 3/60
See application file for complete search history.

(56) References Cited

U.S. PATENT DOCUMENTS 3,730,853 A 5/1973 Schloetter
2010/0301472 A1 12/2010 Migita et al.
(Continued)

FOREIGN PATENT DOCUMENTS

CN 101922026 A 12/2010
CN 103154328 A 6/2013
(Continued)

OTHER PUBLICATIONS

International Search Report dated May 14, 2019, issued for PCT/JP2019/011349 and English translation thereof.
(Continued)

*Primary Examiner* — William A Harriston
(74) *Attorney, Agent, or Firm* — Locke Lord LLP

(57) ABSTRACT

This tin or tin alloy plating solution includes a soluble salt including at least a stannous salt (A), an acid selected from an organic acid and an inorganic acid or a salt thereof (B), a surfactant (C), benzalacetone (D), and a solvent (E), wherein the plating solution is used to form a pattern in which bump diameters are different from each other on a base material, an amount of the benzalacetone (D) is 0.05 g/L to 0.2 g/L, a mass ratio (C/D) of the surfactant (C) to the benzalacetone (D) is 10 to 200, and a mass ratio (E/D) of the solvent (E) to the benzalacetone (D) is 10 or more.

2 Claims, 2 Drawing Sheets

(51) Int. Cl.
  *C25D 5/50* (2006.01)
  *C25D 7/12* (2006.01)
  *H01L 23/00* (2006.01)
(52) U.S. Cl.
  CPC ............ *H01L 24/11* (2013.01); *H01L 24/13* (2013.01); *H01L 2224/11462* (2013.01); *H01L 2224/11849* (2013.01); *H01L 2224/1312* (2013.01); *H01L 2224/13109* (2013.01); *H01L 2224/13111* (2013.01); *H01L 2224/13113* (2013.01); *H01L 2224/13118* (2013.01); *H01L 2224/13139* (2013.01); *H01L 2224/13147* (2013.01); *H01L 2224/13155* (2013.01); *H01L 2224/1403* (2013.01)

(56) References Cited

U.S. PATENT DOCUMENTS

2016/0130712 A1\* 5/2016 Hori ................. H05K 3/187
                                                            205/125
2019/0198474 A1\* 6/2019 Abraham ............ H01L 23/488

FOREIGN PATENT DOCUMENTS

| CN | 106222710 A | 12/2016 |
|---|---|---|
| CN | 106835210 A | 6/2017 |
| JP | H03-17912 B2 | 3/1991 |
| JP | H11-001791 A | 1/1999 |
| JP | 2006-348347 A | 12/2006 |
| JP | 2010-283035 A | 12/2010 |
| JP | 2013-530544 A | 7/2013 |
| JP | 2014-125662 A | 7/2014 |
| JP | 2015-007276 A | 1/2015 |
| JP | 2015-193916 A | 11/2015 |
| JP | 2016-074963 A | 5/2016 |
| JP | 2017-031447 A | 2/2017 |
| JP | 2017-218662 A | 12/2017 |
| WO | 2012/004137 A2 | 1/2012 |
| WO | 2013/046731 A1 | 4/2013 |
| WO | 2017/217387 A1 | 12/2017 |

OTHER PUBLICATIONS

International Search Report dated May 14 2019, issued for PCT/JP2019/011348 and English translation thereof.
Office Action dated Aug. 27, 2019, issued for Japanese Patent Application No. 2018-052012 and English translation thereof.
Notice of Allowance dated May 18, 2020, issued for Taiwanese patent application No. 108109402 and English translation of the Search Report.

\* cited by examiner

TIN OR TIN ALLOY PLATING SOLUTION AND BUMP FORMING METHOD

TECHNICAL FIELD

The present invention relates to a tin or tin alloy plating solution for forming a tin or tin alloy-plated film using an electroplating method and a bump forming method (method for forming bumps) using the same. More specifically, the present invention relates to a tin or tin alloy plating solution including benzalacetone, which is suitable for forming solder bumps having different bump diameters on a base material such as a semiconductor wafer, and a bump forming method (method for forming bumps) using the same.

The present application claims priority on Japanese Patent Application No. 2018-52012 filed on Mar. 20, 2018, Japanese Patent Application No. 2018-57551 filed on Mar. 26, 2018, and Japanese Patent Application No. 2019-40216 filed on Mar. 6, 2019, the contents of which are incorporated herein by reference.

BACKGROUND ART

Patent Document 1 discloses the following matters. In the related art, vias having a structure in which an aspect ratio or the like is specified are formed on a base material such as a substrate for mounting a semiconductor chip. A method for forming bump electrodes is disclosed, and the bump electrodes are formed by filling vias having the above-described structure by an electroplating method using a tin or tin alloy plating bath which includes both of a specific filling organic compound (C) such as benzalacetone and a nonionic surfactant (D). According to this method, at the time of forming the bump electrodes in the vias on the base material by the electroplating of tin or a tin alloy, due to the coexistence of the component (C) and the component (D), the precipitation of metal in an upper portion of the via is effectively suppressed, and the precipitation of metal is preferentially progressed from a bottom portion of the via. Therefore, it is possible to smoothly fill the via without generating any voids.

In addition, Patent Document 2 discloses an aqueous acidic tin, lead, or tin-lead alloy electroplating bath consisting of (a) a bath-soluble metallic salt selected from the group consisting of a divalent tin salt of alkanesulfonic acid, a divalent lead salt of alkanesulfonic acid, and a mixture of a divalent tin salt of alkanesulfonic acid and a divalent lead salt of alkanesulfonic acid; (b) alkanesulfonic acid; (c) a brightener such as a mixture of α-naphthaldehyde and benzylideneacetone (benzalacetone); (d) a defoamer including a mixture of silicone and silica and/or silicate in propylene glycol; (e) a first nonionic surfactant consisting of ethoxylated allylphenol; and (f) a second nonionic surfactant consisting of ethoxylated short-chain alcohol. In addition, it is disclosed that α-naphthaldehyde, which is the brightener, is present in a concentration of approximately 0.02 g/L to approximately 5 g/L and benzylideneacetone (benzalacetone) is present in a concentration of approximately 0.02 g/L to approximately 5 g/L. This electroplating bath has an intrinsic capability of generating little or no bubbles during electroplating even under a high-speed plating condition such as a condition generated by a high current density of the bath and/or vigorous circulation. In addition, this bath is considered to generate a homogenous and excellent precipitate of tin and/or lead.

Furthermore, Patent Document 3 discloses an aqueous acidic tin, lead, or tin-lead alloy electroplating bath including approximately 15.0 g/L to approximately 350.0 g/L of metallic ions selected from the group consisting of tin ions, lead ions, and an ion mixture thereof, approximately 100.0 g/L to approximately 500.0 g/L of a radical selected from the group consisting of fluoroborate, fluorosilicate, sulfamate, and a salt mixture thereof, and approximately 10.0 g/L to approximately 25.0 g/L of a specific alkylallyl surfactant of an alkoxylated aliphatic acid and having a pH of approximately lower than 3.0. This electroplating bath further includes a carbonyl-containing compound selected from the group consisting of benzylideneacetone (benzalacetone), 3-butylaldehyde, thienylaldehyde, tolualdehyde, cinnamaldehyde, and anisaldehyde in an amount of approximately 0.1 g/L to approximately 10.0 g/L. According to this electroplating bath, a simple and efficient electroplating process in which a sufficiently glossy tin-lead alloy plate is deposited is provided. Therefore, it is considered that a sufficiently glossy tin-lead alloy can be produced under an economically efficient condition and a product having a glossy appearance electroplated with a tin-lead alloy is provided.

In recent years, wiring patterns having different bump diameters or bump pitches have been present in a mixed form on one base material such as a wafer substrate. In such complicated patterns, there is a demand for forming bumps having, particularly, different bump diameters in a uniform height. The plating baths of Patent Documents 1 to 3 have excellent characteristics such that a via can be smoothly filled without generating any voids, a homogeneous precipitate can be generated without generating bubbles during electroplating, a sufficiently glossy product can be produced in a simple and economically efficient manner, and the like. However, the objects of the plating solutions in Patent Document 1 to 3 are not to achieve the uniformity in height among bumps having different bump diameters (hereinafter, also referred to as "height uniformity of bumps" in some cases) when the bumps having different bump diameters (hereinafter, also referred to as "different diameters" in some cases) are formed on one base material.

Specifically, an example of forming bumps in a pattern in which bump diameters are different from each other will be described using FIG. 2. As shown in FIG. 2(a), first, a titanium layer 2 and a copper seed layer 3 are sequentially formed on a surface of a base material 1 such as a semiconductor wafer substrate. Next, a resist layer 4 is formed, and this resist layer 4 is mask-exposed and developed; and thereby, a resist pattern 5 including vias 4a and 4b having different diameters is formed. Next, the copper seed layer 3 in these vias 4a and 4b is plated with copper or nickel; and thereby, a foundation layer 6 is formed. Next, the insides of the vias 4a and 4b in the resist pattern 5 are subjected to tin electroplating by using a tin plating solution and supplying electricity through the copper seed layer 3, and tin plated-deposited layers (tin-plated films) 7a and 7b are respectively formed in the vias 4a and 4b on the foundation layer 6. Subsequently, as shown in FIG. 2(b), the resist layer 4, the copper seed layer 3, and the titanium layer 2 are sequentially removed. Next, the remaining tin plated-deposited layers 7a and 7b are melted by a reflow treatment. As a result, as shown in FIG. 2(c), tin bumps 8a and 8b are formed. In these tin bumps, the height of the bump 8b having a large bump diameter is taller than the height of the bump 8a having a small bump diameter, a difference D in height is caused, and it is not possible to achieve the height uniformity of the bumps (improvement in height uniformity of bumps).

Even in the case of carrying out electroplating using the plating solution including benzalacetone of the related art, which is described in Patent Documents 1 to 3, it is difficult to achieve the height uniformity of bumps (improvement in height uniformity of bumps).

In the present specification, a pattern in which bump diameters are different from each other, that is, a "different-diameter pattern" refers to a pattern in which the ratio S max/S min) of the maximum foundation layer area S max to the minimum foundation layer area S min is 1.5 or more. In the plating solutions of the related art, in the case where S max/S min is 1.5 or more, it becomes difficult to suppress the height variation among different-diameter bumps. The upper limit value of S max/S min is not particularly limited, but is approximately 30.

PRIOR ART DOCUMENTS

Patent Documents

Patent Document 1: Japanese Unexamined Patent Application, First Publication No. 2016-74963
Patent Document 2: Japanese Examined Patent Application, Second Publication No. H03-17912
Patent Document 3: U.S. Pat. No. 3,730,853

DISCLOSURE OF INVENTION

Problems to be Solved by the Invention

An object of the present invention is to provide a tin or tin alloy plating solution by which void-free bumps having a small height variation among large-diameter bumps and small-diameter bumps formed after reflow and having uniformity in bump height can be obtained even in a pattern in which bump diameters are different from each other, and a method for forming bumps using the same.

Solutions for Solving the Problems

A tin or tin alloy plating solution according to a first aspect of the present invention includes: a soluble salt including at least a stannous salt (A); an acid selected from an organic acid and an inorganic acid or a salt thereof (B); a surfactant (C); benzalacetone (D); and a solvent (E), in which the plating solution is used to form a pattern in which bump diameters are different from each other on a base material, the benzalacetone (D) is included in the plating solution in an amount of 0.05 g/L to 0.2 g/L, a mass ratio (C/D) of the surfactant (C) to the benzalacetone (D) is 10 to 200, and a mass ratio (E/D) of the solvent (E) to the benzalacetone (D) is 10 or more.

A second aspect of the present invention is the tin or tin alloy plating solution according to the first aspect, in which the surfactant (C) is a nonionic surfactant obtained by condensing polyoxyethylene (EU) and polyoxypropylene (PO) or a nonionic surfactant obtained by condensing any one selected from phenol, alkylphenol, styrenated phenol, β-naphthol, bisphenols, and cumylphenol and polyoxyethylene (EO).

A method for forming bumps according to a third aspect of the present invention includes: a step of forming a plurality of tin or tin alloy plated-deposited layers having different diameters on a base material using the tin or tin alloy plating solution according to the first or second aspect; and a subsequent step of carrying out a reflow treatment to form a plurality of bumps having different bump diameters.

Effects of Invention

In the tin or tin alloy plating solution of the first aspect of the present invention, the benzalacetone (D) is included in the plating solution in an amount of 0.05 g/L to 0.2 g/L. The mass ratio (C/D) of the surfactant (C) to the benzalacetone (D) is set to be 10 to 200. In addition, the mass ratio (E/D) of the solvent (E) to the benzalacetone (D) is set to be 10 or more. When the insides of vias in a resist pattern 15 are subjected to tin electroplating by using this plating solution and supplying electricity through a copper seed layer 13 as shown in FIG. 1(a), the benzalacetone in the plating solution is adsorbed to bottom portions of the vias, and the precipitation of tin is impaired. In a large-diameter via 14b which the plating solution easily enters, the benzalacetone is easily adsorbed, and an effect of suppressing the precipitation of tin is strong. In contrast, in a small-diameter via 14a which the plating solution does not easily enter, compared with the large-diameter via 14b, the adsorption amount of the benzalacetone is relatively small, and the effect of suppressing the precipitation of tin is weak. Therefore, the film thickness of a plated-deposited layer 17b in the large-diameter via 14b is formed thinner compared with the film thickness of a plated-deposited layer 17a in the small-diameter via 14a. As shown in FIG. 1(b), when the resist layer 14 and the seed layers 13 and 12 are sequentially removed, and then the remaining plated-deposited layers 17a and 17b are melted by a reflow treatment, as shown in FIG. 1(c), void-free tin bumps (plated film) 18a and 18b having a small variation in bump height are formed. Therefore, it is possible to obtain an electronic component equipped with solder bumps which includes a substrate, a plurality of foundation layers with different areas formed on the substrate, and a plurality of solder bumps respectively formed on the plurality of foundation layers and has a height variation among the plurality of solder bumps of 10% or less.

In the tin or tin alloy plating solution of the second aspect of the present invention, the surfactant (C) is adsorbed to the surface of the plated film, whereby the crystal growth of tin is suppressed, and crystals are refined. Thereby, actions of an improvement in the appearance of the plated film, an improvement of adhesiveness between the plated film and an article to be plated, uniforming of the film thicknesses, and the like are obtained, and, together with the benzalacetone (D), the surfactant more effectively exhibits the above-described effect in a synergistic manner.

In the method for forming bumps of the third aspect of the present invention, tin or tin alloy plated-deposited layers having different diameters are formed on a base material using the tin or tin alloy plating solution of the first aspect or the second aspect of the present invention. Next, a reflow treatment is carried out. Thereby, it is possible to form void-free bumps having a uniform height even in a pattern in which bump diameters are different from each other.

According to the first to third aspects of the present invention, it is possible to provide an electronic component equipped with different-diameter bumps having a bump height uniformity on a base material. When this electronic component is used, it is possible to produce a highly reliable semiconductor device in which poor electric connection does not occur.

BRIEF DESCRIPTION OF DRAWINGS

FIG. 1(a) shows a cross-sectional view in which plated-deposited layers having different diameters are formed in vias. FIG. 1(b) shows a cross-sectional view of the plated-deposited layers having different diameters after a resist layer, a titanium layer, and a copper seed layer are peeled off. FIG. 1(c) shows a cross-sectional view of bumps having different diameters in which heights of the bumps after a reflow treatment are uniform.

FIG. 2(a) shows a cross-sectional view in which plated-deposited layers having different diameters are formed in vias. FIG. 2(b) shows a cross-sectional view of the plated-deposited layers having different diameters after a resist layer, a titanium layer, and a copper seed layer are peeled off. FIG. 2(c) shows a cross-sectional view of bumps having different diameters in which heights of the bumps after a reflow treatment are non-uniform.

EMBODIMENTS FOR CARRYING OUT THE INVENTION

Figure 1:
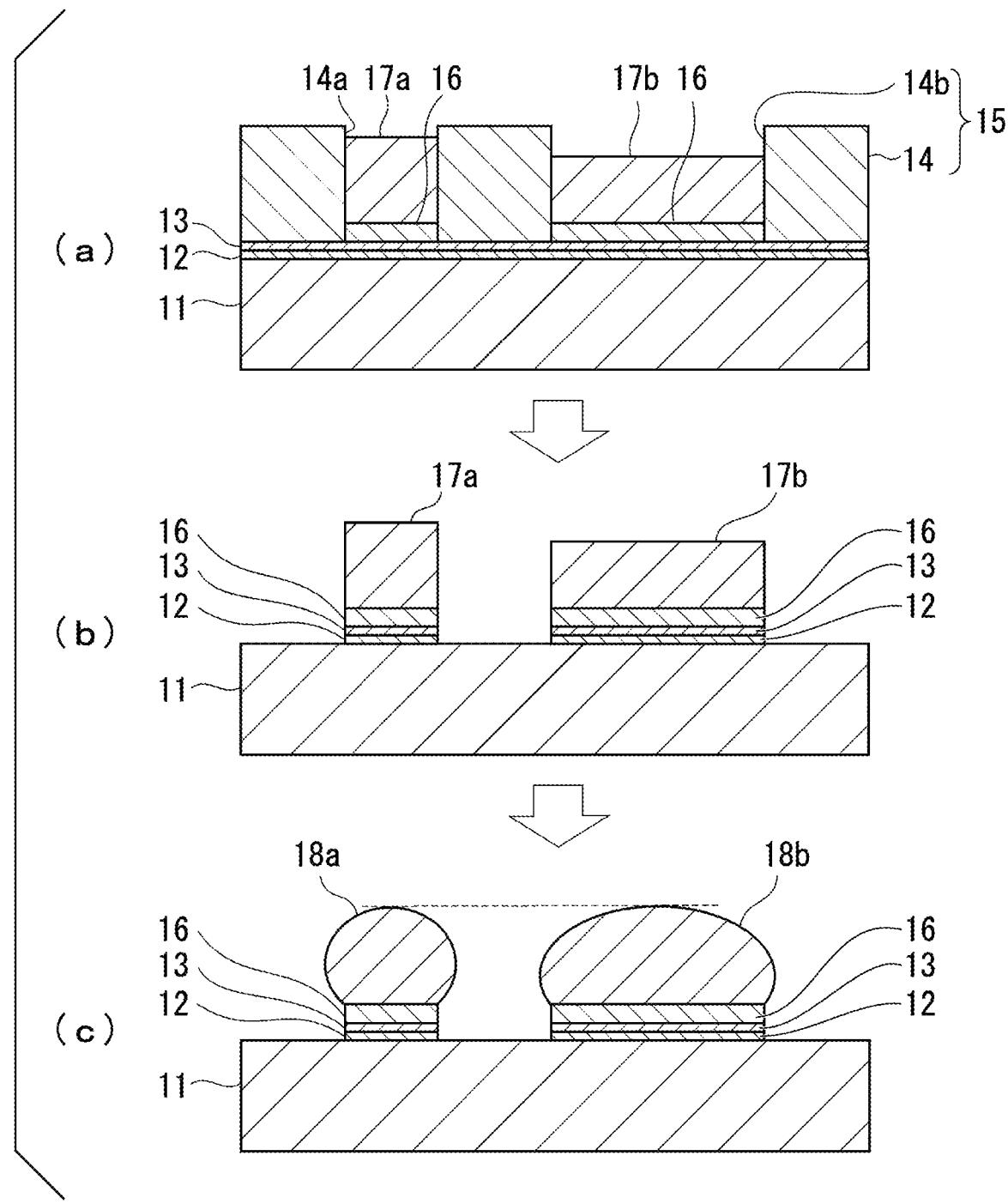
FIG. 1 is views showing steps of forming bumps in a pattern in which bump diameters are different from each other in the present embodiment.
Figure 2:
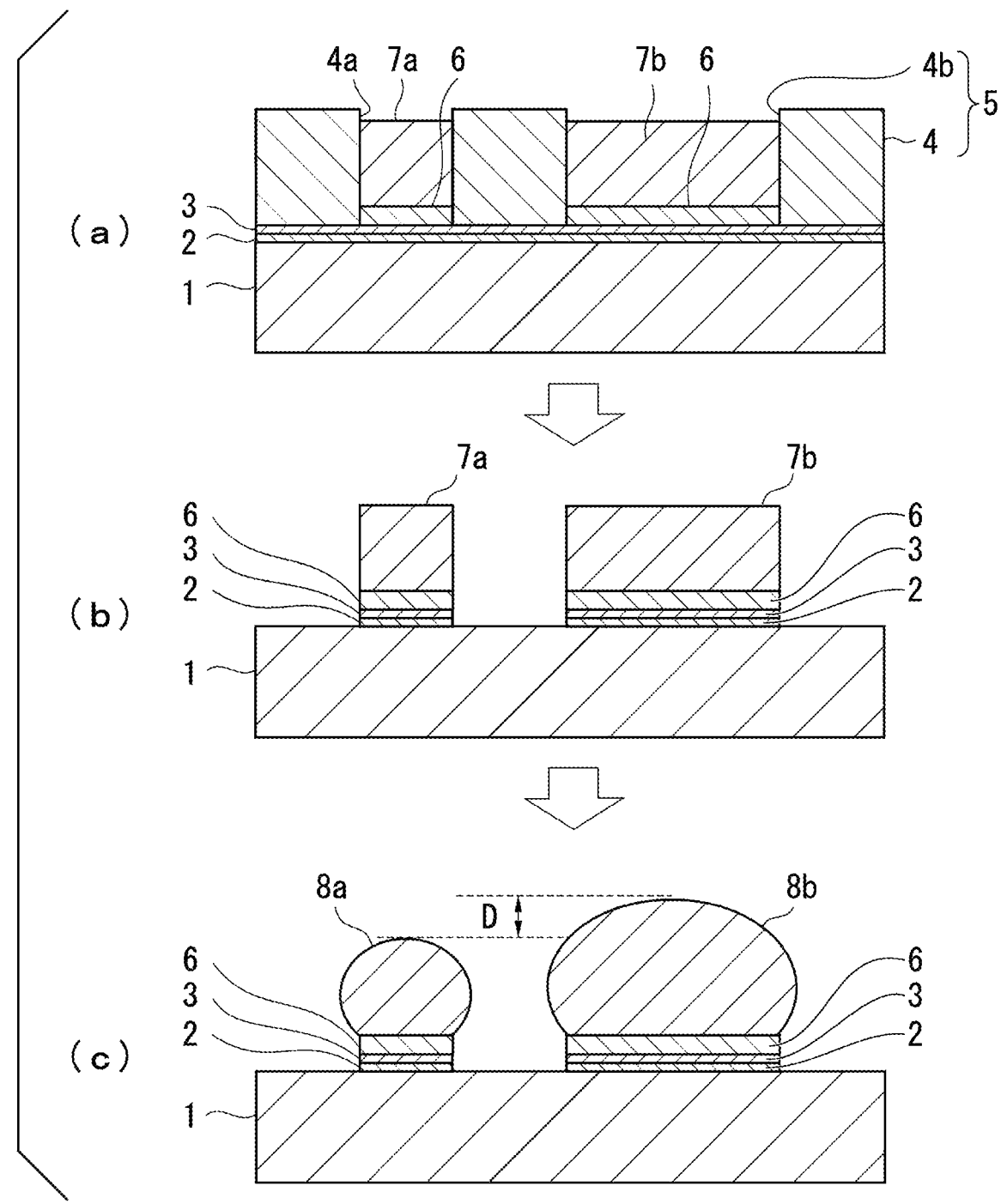
FIG. 2 is views showing steps of forming bumps in a pattern in which bump diameters are different from each other in a related art.

Next, an embodiment for carrying out the present invention will be described.

A tin or tin alloy plating solution of the present embodiment is a tin or tin alloy plating solution including a soluble salt including at least a stannous salt (A), an acid selected from an organic acid and an inorganic acid or a salt thereof (B), a surfactant (C), benzalacetone (D), and a solvent (E). Characteristics thereof are that the plating solution is used to form a pattern in which bump diameters are different from each other on a base material, the benzalacetone is included in the plating solution in an amount of 0.05 g/L to 0.2 g/L, a mass ratio (C/D) of the surfactant (C) to the benzalacetone (D) is 10 to 200, and a mass ratio (E/D) of the solvent (E) to the benzalacetone (D) is 10 or more. The base material of the present embodiment also refers to a semiconductor wafer and a substrate for mounting a semiconductor chip.

The tin alloy of the present embodiment is an alloy of tin and one or more metals selected from silver, copper, bismuth, nickel, antimony, indium, and zinc. Examples thereof include binary alloys such as a tin-silver alloy, a tin-copper alloy, a tin-bismuth alloy, a tin-nickel alloy, a tin-antimony alloy, a tin-indium alloy, and a tin-zinc alloy and ternary alloys such as tin-copper-bismuth alloy and a tin-copper-silver alloy.

[Soluble Salt Including at Least Stannous Salt (A)]

The soluble salt (A) of the present embodiment consists of either one of a stannous salt or a mixture of a stannous salt and a salt of one or more metals selected from the group consisting of silver, copper, bismuth, nickel, antimony, indium, and zinc.

Therefore, the soluble salt (A) of the present embodiment refers to a arbitrary soluble salt generating a variety of metallic ions such as $Sn^{2+}$, $Ag^+$, $Cu^+$, $Cu^{2+}$, $Bi^{3+}$, $Ni^{2+}$, $Sb^{3+}$, $In^{3+}$, and $Zn^{2+}$ in the plating solution. Examples of the soluble salt include oxides and halides of these metals, metallic salts of an inorganic acid or an organic acid, and the like.

Examples of the oxides of the metals include stannous oxide, silver oxide, copper oxide, nickel oxide, bismuth oxide, antimony oxide, indium oxide, zinc oxide, and the like.

Examples of the halides of the metals include stannous chloride, bismuth chloride, bismuth bromide, cuprous chloride, cupric chloride, nickel chloride, antimony chloride, indium chloride, zinc chloride, and the like.

Examples of the metallic salts of an inorganic acid or an organic acid include copper sulfate, stannous sulfate, bismuth sulfate, nickel sulfate, antimony sulfate, bismuth nitrate, silver nitrate, copper nitrate, antimony nitrate, indium nitrate, nickel nitrate, zinc nitrate, copper acetate, nickel acetate, nickel carbonate, sodium stannate, tin(II) tetrafluoroborate, stannous methanesulfonate, silver methanesulfonate, copper methanesulfonate, bismuth methanesulfonate, nickel methanesulfonate, indium metasulfonate, zinc bismethanesulfonate, stannous ethanesulfonate, bismuth 2-hydroxypropanesulfonate, and the like.

[Acid Selected from Organic Acid and Inorganic Acid or Salt Thereof (B)]

The acid or the salt thereof (B) of the present embodiment is selected from an organic acid, an inorganic acid, and a salt thereof.

Examples of the organic acid include organic sulfonic acids such as alkanesulfonic acid, alkanolsulfonic acid, and aromatic sulfonic acid, aliphatic carboxylic acids, and the like.

Examples of the inorganic acid include fluoroboric acid, hexafluorosilicic acid, sulfamic acid, hydrochloric acid, sulfuric acid, nitric acid, perchloric acid, and the like.

Examples of the salt thereof include a salt of an alkali metal, a salt of an alkaline-earth metal, an ammonium salt, an amine salt, sulfonate, and the like.

As the component (B), organic sulfonic acid is preferred from the viewpoint of the solubility of the metallic salt and the easiness in a drainage treatment.

As the alkanesulfonic acid, an alkanesulfonic acid represented by a chemical formula $C_nH_{2n+1}SO_3H$ (for example, n=1 to 5 and preferably 1 to 3) can be used. Specifically, methanesulfonic acid, ethanesulfonic acid, 1-propanesulfonic acid, 2-propanesulfonic acid, 1-butanesulfonic acid, 2-butanesulfonic acid, pentanesulfonic acid, hexanesulfonic acid, decanesulfonic acid, dodecanesulfonic acid and the like are exemplified.

As the alkanolsulfonic acid, an alkanolsulfonic acid represented by a chemical formula $C_pH_{2p+1}$—CH(OH)—$C_qH_{2q}$—$SO_3H$ (for example, p=0 to 6 and q=1 to 5) can be used. Specifically, 2-hydroxyethane-1-sulfonic acid, 2-hydroxypropane-1-sulfonic acid, 2-hydroxybutane-1-sulfonic acid, 2-hydroxypentane-1-sulfonic acid, 1-hydroxypropane-2-sulfonic acid, 3-hydroxypropane-1-sulfonic acid, 4-hydroxybutane-1-sulfonic acid, 2-hydroxyhexane-1-sulfonic acid, 2-hydroxydecane-1-sulfonic acid, 2-hydroxydodecane-1-sulfonic acid, and the like are exemplified.

The aromatic sulfonic acid is, basically, benzenesulfonic acid, alkylbenzenesulfonic acid, phenolsulfonic acid, naphthalenesulfonic acid, alkylnaphthalenesulfonic acid, or the like. Specifically, 1-naphthalenesulfonic acid, 2-naphthalenesulfonic acid, toluenesulfonic acid, xylenesulfonic acid, p-phenolsulfonic acid, cresolsulfonic acid, sulfosalicylic acid, nitrobenzenesulfonic acid, sulfobenzoic acid, diphenylamine-4-sulfonic acid, and the like are exemplified.

Examples of the aliphatic carboxylic acids include acetic acid, propionic acid, butyric acid, citric acid, tartaric acid, gluconic acid, sulfosuccinic acid, trifluoroacetic acid, and the like.

[Surfactant (C)]

The surfactant (C) of the present embodiment has an action of enhancing an effect for suppressing the precipitation of tin together with the benzalacetone (D) in a synergistic manner. As the surfactant (C), a nonionic surfactant obtained by condensing polyoxyethylene (EO) and polyoxypropylene (PO) or a nonionic surfactant obtained by condensing any one selected from phenol, alkylphenol, styrenated phenol, β-naphthol, bisphenols, and cumylphenol and polyoxyethylene (EO) is preferred.

As an EOPO condensate (a condensate obtained by condensing polyoxyethylene (EO) and polyoxypropylene (PO)), specifically, N,N-dipolyalkyleneoxide N-alkylamine represented by Formula (1) is preferred. This N,N-dipolyalkyleneoxide N-alkylamine has one alkyl group (R) in which the number of carbon atoms is in a range of five or more and 20 or less and two polyalkylene oxide groups (X and Y) each independently including an ethylene oxide group (EO group) and a propylene oxide group (PO group) in a range of 30:70 to 70:30 in terms of a molar ratio (EU group:PO group).

The EU group is hydrophilic, and the PO group is hydrophobic. Therefore, the water solubility of N,N-dipolyalkyleneoxide N-alkylamine and the adsorption property of tin or a tin alloy to a surface are exhibited in a well-balanced manner. That is, in the plating solution of the present embodiment, the ratio between the EO group and the PO group is in the above-described range, and both the EO group and the PO group are present in a well-balanced manner, and thus the nonionic surfactant has a high affinity to tin or a tin alloy and is easily adsorbed to the surface of a plated film. A plurality of surfactant molecules are adsorbed to the surface of the plated film; and thereby, a layer-shaped film is formed, and a precipitation reaction of the metal is suppressed. Therefore, it is considered that the plated film thickness becomes uniform due to this surfactant.

The mass-average molecular weight of the N,N-dipolyalkyleneoxide N-alkylamine is preferably in a range of 500 or more and 30,000 or less. In the case where the mass-average molecular weight is too small, there is a concern that the effect for suppressing the precipitation of tin or a tin alloy is not sufficient. On the other hand, in the case where the mass-average molecular weight is too large, there is a concern that the suppressing force may become too strong and a uniform plated film may not be formed. Single N,N-dipolyalkyleneoxide N-alkylamine may be used or combination of two or more N,N-dipolyalkyleneoxide N-alkylamines may be used.

The amount of the N,N-dipolyalkyleneoxide N-alkylamine in the plating solution of the present embodiment is preferably in a range of 0.1 g/L or more and 100 g/L or less and more preferably in a range of 1 g/L or more and 50 g/L or less. In the case where the amount of the N,N-dipolyalkyleneoxide N-alkylamine is excessively small or excessively large, there is a concern that a uniform plated film may not be formed.

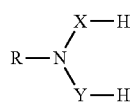

(1)

Examples of the nonionic surfactant obtained by condensing phenol and polyoxyethylene (EO) include polyoxyethylene phenyl ether.

Examples of the nonionic surfactant obtained by condensing alkylphenol and polyoxyethylene (EU) include polyoxyethylene octylphenyl ether, polyoxyethylene nonylphenyl ether, and polyoxyethylene dodecylphenyl ether.

Examples of the nonionic surfactant obtained by condensing styrenated phenol and polyoxyethylene (EO) include polyoxyethylene monostyrenated phenyl ether, polyoxyethylene distyrenated phenyl ether, and polyoxyethylene tristyrenated phenyl ether.

Examples of the nonionic surfactant obtained by condensing β-naphthol and polyoxyethylene (EO) include polyoxyethylene β-naphthyl ether.

Examples of the nonionic surfactant obtained by condensing bisphenols and polyoxyethylene (EO) include polyoxyethylene bisphenol A ether, polyoxyethylene bisphenol E ether, polyoxyethylene bisphenol F ether, polyoxyethylene bisphenol S ether, and polyoxyethylene bisphenol M ether.

Examples of the nonionic surfactant obtained by condensing cumylphenol and polyoxyethylene (EO) include polyoxyethylene cumylphenyl ether.

The mass-average molecular weights of these nonionic surfactants are preferably in a range of 100 or more and 5,000 or less. In the case where the mass-average molecular weight is too small, there is a concern that the effect for suppressing the precipitation of tin or a tin alloy is not sufficient. On the other hand, in the case where the mass-average molecular weight is too large, there is a concern that the suppressing force may become too strong and a uniform plated film may not be formed.

As the surfactant (C) of the present embodiment, instead of the above-described surfactants, a single different surfactant may be used. Alternatively, a different surfactant may be used together with the above-described surfactants. Examples of the different surfactant in this case include ordinary anionic surfactants, cationic surfactants, nonionic surfactants, and amphoteric surfactants.

Examples of the anionic surfactants include polyoxyalkylene alkyl ether sulfates such as sodium polyoxyethylene (containing 12 mol of ethylene oxide) nonyl ether sulfate; polyoxyalkylene alkyl phenyl ether sulfates such as sodium polyoxyethylene (containing 12 mol of ethylene oxide) dodecylphenyl ether sulfate; alkylbenzene sulfonates such as sodium dodecylbenzene sulfonate; naphthol sulfonates such as sodium 1-naphthol-4-sulfonate and disodium 2-naphthol-3,6-disulfonate; (poly)alkylnaphthalenesulfonates such as sodium diisopropylnaphthalenesulfonate and sodium dibutylnaphthalenesulfonate; alkyl sulfates such as sodium dodecyl sulfate and sodium oleyl sulfate; and the like.

Examples of the cationic surfactants include monoalkylamine salts, dialkylamine salts, trialkylamine salts, dimethyldialkylammonium salts, trimethylalkylammonium salts, dodecyltrimethylammonium salts, hexadecyltrimethylammonium salts, octadecyltrimethylammonium salts, dodecyldimethylammonium salts, octadecenyldimethylethylammonium salt, dodecyldimethylbenzylammonium salt, hexadecyldimethylbenzylammonium salt, octadecyldimethylbenzylammonium salt, trimethylbenzylammonium salt, triethylbenzylammonium salt, hexadecylpyridinium salt, dodecylpyridinium salt, dodecylpicolinium salt, dodecylimidazolinium salt, oleylimidazolinium salt, octadecylamine acetate, dodecylamine acetate, and the like.

Examples of the nonionic surfactants other than the above-described nonionic surfactant include linear alkyl polyoxyethylene ethers, branched alkyl polyoxyethylene ethers, alkylphenol polyoxyethylene ethers, silicon-based polyoxyethylene ethers, silicon-based polyoxyethylene esters, fluorine-based polyoxyethylene ethers, fluorine-based polyoxyethylene esters, condensation products of ethylene oxide and/or propylene oxide and an alkylamine or a diamine, sulfated or sulfonated adducts thereof, and the like.

Examples of the amphoteric surfactants include betaine, carboxybetaine, imidazolinium betaine, sulfobetaine, aminocarboxylic acid and the like.

[Benzalacetone (D)]

As the benzalacetone (D) of the present embodiment, a commercially available benzalacetone can be used as it is. In addition, it is possible to use a purified product obtained by purifying a commercially available benzalacetone to remove a contained impurity.

The benzalacetone (D) is adsorbed to a surface of an article to be plated and impairs the crystal growth of tin by electrocrystallization and thus has an effect for suppressing the deposition of a plated film.

In addition, the benzalacetone is easily adsorbed to a large-diameter via which the plating solution easily enters, and an effect of suppressing plating is strong. In contrast, the benzalacetone is not easily adsorbed to a small-diameter via which the plating solution does not easily enter, and the effect of suppressing plating is weak.

Therefore, compared with the formation of a plated-deposited layer in a small-diameter via, the formation of a plated-deposited layer in a large-diameter via is further suppressed. Therefore, a plated film in a large-diameter via is formed thinner than a plated film in a small-diameter via. When the above-described plated film is melted by a reflow treatment, bumps having no variation in height are obtained.

The amount of the benzalacetone is preferably adjusted depending on the degree of difference in diameter among different-diameter bumps. Specifically, as the difference in diameter among different-diameter bumps increases, the blended amount of the benzalacetone preferably increases.

[Solvent (E)]

As the solvent (E) of the present embodiment, an alcohol having 1 to 3 carbon atoms is preferred. The alcohol having 1 to 3 carbon atoms improves the solubility of the surfactant or the benzalacetone. Examples of this alcohol include methanol, ethanol, 1-propanol, 2-propanol (isopropyl alcohol), and the like. Single alcohol can be used or combination of two or more alcohols can be used.

[Production of Tin or Tin Alloy Plating Solution]

The tin or tin alloy plating solution of the present embodiment can be prepared by mixing the soluble tin salt (A), the acid selected from an organic acid and an inorganic acid or a salt thereof (B), the surfactant (C), the benzalacetone (D), the solvent (E), and water (remainder).

The benzalacetone (D) is added to the plating solution such that the concentration thereof becomes 0.05 g/L to 0.2 g/L, preferably 0.06 g/L to 0.18 g/L, and more preferably 0.08 g/L to 0.15 g/L. As the difference between different via diameters increases, the benzalacetone is added in a larger amount in the above-described range. In the case where the concentration is less than 0.05 g/L, the above-described effect of the benzalacetone is weak, and it is not possible to decrease the variation in height among different-diameter bumps after reflow. In the case where the concentration exceeds 0.2 g/L, the benzalacetone is excessively adsorbed to the bottom portion of the via, the surface of the plated film becomes rough and thus black (a phenomenon generally referred to as burnt and charred occurs), and the appearance of the plated film becomes poor.

In addition, the surfactant and the benzalacetone are mixed together such that the mass ratio (C/D) of the surfactant (C) to the benzalacetone (D) becomes in a range of 10 to 200, preferably 30 to 180, and more preferably 50 to 150. In the case where the mass ratio C/D is less than 10 or more than 200, the action of suppressing the precipitation of tin by a synergistic effect of the benzalacetone and the surfactant does not sufficiently work, and the action of suppressing the precipitation of tin in the large-diameter bumps (vias) becomes weak. Therefore, it is not possible to decrease the variation in height among different-diameter bumps after reflow.

In addition, the concentration of the surfactant (C) in the plating solution is preferably set to to be 5 g/L to 20 g/L. In the case where the amount of the surfactant (C) becomes excessively small or large, there is a concern that a uniform plated film may not be formed. More preferably, a concentration of 5 to 10 g/L is appropriate.

Furthermore, the solvent and the benzalacetone are mixed together such that the mass ratio (E/D) of the solvent (E) to the benzalacetone (D) becomes 10 or more, preferably 20 or more, and more preferably 30 or more. In the case where the mass ratio E/D is less than 10, a necessary amount of the benzalacetone does not dissolve in the solvent, and it is not possible to produce the plating solution. The upper limit of the mass ratio E/D is not particularly limited, but is preferably set to be 300 or less. In the case where the mass ratio E/D exceeds 300, the solvent is used more than necessary, and this creates a concern that the cost of the plating solution may increase.

In addition, the concentration of the solvent (E) in the plating solution is preferably set to be 0.5 g/L to 20 g/L. In the case where the concentration is less than 0.5 g/L, the benzalacetone (D) is precipitated in the plating solution, and it is not possible to decrease the variation in height among different-diameter bumps after reflow. In the case where the concentration exceeds 20 g/L, there is a concern that the cost of the plating solution may increase. More preferably, a concentration of 0.5 to 10 g/L is appropriate.

In addition, single soluble metallic salt (A) can be used, and a mixture of two or more soluble metallic salts can also be used. The amount of the soluble metallic salt (A) in the plating solution is 10 to 200 g/L and preferably 50 to 100 g/L. In the case where the amount is not in an appropriate range, it becomes impossible to obtain a plated film having a flat surface and a favorable uniformity in film thickness.

Single inorganic acid, the organic acid, or the salt thereof (B) can be used, and a mixture of two or more acids or salts can also be used. The amount of the inorganic acid, the organic acid, or the salt thereof (B) in the plating solution is 10 to 300 g/L and preferably 100 to 200 g/L. In the case where the amount is not in an appropriate range, it becomes impossible to obtain a plated film having a flat surface and a favorable uniformity in film thickness.

[Method for Forming Bumps]

A method for forming bumps using the plating solution of the present embodiment will be described. As shown in FIG. 1(a), first, a titanium layer 12 and a copper seed layer 13 are sequentially formed on a surface of a base material 11 such as a semiconductor wafer substrate. For example, the titanium layer 12 is formed by a sputtering method in a thickness of approximately 100 nm, and the copper seed layer 13 is formed by the sputtering method in a thickness of approximately 500 nm. Next, a resist layer 14 having a predetermined thickness is formed. This resist layer 14 is mask-exposed and developed; and thereby, a resist pattern 15 including vias 14a and 14b having different diameters is formed. Next, the copper seed layer 13 in these vias 14a and 14b is plated with copper or nickel; and thereby, a foundation layer 16 is formed. Next, the insides of the vias 14a and 14b in the resist pattern 15 are subjected to tin electroplating by using the above-described tin plating solution of the present embodiment and supplying electricity through the copper seed layer 13. Thereby, tin or tin alloy plated-deposited layers (tin or tin alloy-plated films) 17a and 17b are respectively formed in the vias 14a and 14b on the foundation layer 16. Subsequently, as shown in FIG. 1(b), the resist layer 14 is peeled off using an organic solvent. Next, the copper seed layer 13 and the titanium layer 12 are sequentially etched and removed using an acid. Subsequently, the remaining tin or tin alloy plated-deposited layers (tin or tin alloy-plated films) 17a and 17b are melted by a reflow treatment in a nitrogen atmosphere at a temperature of 210° C. to 240° C. As a result, as shown in FIG. 1(c), dome-shaped tin or tin alloy bumps 18a and 18b are formed. The tin or tin alloy bump is not limited to a cylindrical bump having a circular shape in an upper surface view and may be a rectangular column-shaped bump having a triangular shape, a quadrangular shape, or a polygonal shape in an upper surface view or an elliptical column-shaped bump having an elliptic shape in an upper surface view.

The electroplating is carried out at a current density in a range of 0.1 A/dm² or more and 100 A/dm² or less and preferably in a range of 0.5 A/dm² or more and 20 A/dm² or less at the time of forming the plated film. In the case where the current density is too low, the productivity deteriorates, and in the case where the current density is too high, the height uniformity among bumps deteriorates. The liquid temperature is in a range of 10° C. or higher and 50° C. or lower and more preferably in a range of 20° C. or higher and 40° C. or lower.

While not shown, in the method for forming bumps, the resist pattern 15 including the vias 14a and 14b having different diameters may be formed by forming the foundation layer, next, peeling the resist layer 14, forming a different new resist layer, mask-exposing and developing this resist layer such that the diameter thereof becomes equal to the diameter of the foundation layer.

EXAMPLES

Next, examples of the present invention will be described together with comparative examples in detail.

(Preparation of Sn Plating Solution in Electrolytic Bath)

Example 1

First, benzalacetone (D) and methanol (E) were mixed together such that the mass ratio E/D became 10, and benzalacetone was dissolved in methanol. Next, methanesulfonic acid (B) as a free acid and the methanol solution of benzalacetone were mixed into an aqueous solution of stannous methanesulfonate (A); and thereby, a homogeneous solution was obtained. Next, as a surfactant (C), the above-described N,N-dipolyalkyleneoxide N-alkylamine of Formula (1) was prepared. This N,N-dipolyalkyleneoxide N-alkylamine had one alkyl group (R) having 12 carbon atoms and two polyalkylene oxide groups (X and Y) including an EU group and a PO group in a molar ratio (EU group:PO group) of 50:50. This surfactant was added such that the mass ratio C/D became 100. The number of carbon atoms in the alkyl group of the surfactant was 12, and the mass-average molecular weight was 940. In addition, finally, ion exchange water was added; and thereby, a Sn plating solution having the following composition was prepared in an electrolytic bath.

The stannous methanesulfonate aqueous solution was prepared by electrolyzing a metallic Sn plate in a aqueous solution of methanesulfonic acid. In addition, the amount of an alcohol in the plating solution was measured by gas chromatography, and it was confirmed that the amount was almost equal to the blended amount.

(Composition of Sn plating solution)

Stannous methanesulfonate (as $Sn^{2+}$): 80 g/L

Methanesulfonic acid (as free acid): 150 g/L

Nonionic surfactant: 5 g/L

Benzalacetone: 0.05 g/L

Methanol: 0.5 g/L

Ion exchange water: Remainder

The kinds and blended amounts of the components (A) to (E) in the plating solution of Example 1 are shown in Table 1, and the mass ratio (C/D) and the mass ratio (E/D) are shown in Table 4.

TABLE 1

Kinds and blended amounts of components of plating solution

| | Metallic salt A | | Acid B | | Surfactant C | | | Benzalacetone D | Solvent E | |
| | | | | | R: Number of carbon atoms | EO:PO | | | | |
| | Kind | (g/L) | Kind | (g/L) | atoms | EO:PO | (g/L) | (g/L) | Kind | (g/L) |
|---|---|---|---|---|---|---|---|---|---|---|
| Example 1 | Stannous methanesulfonate | 80 | Methanesulfonic acid | 150 | 12 | 50:50 | 5 | 0.05 | MeOH | 0.5 |
| Example 2 | Stannous methanesulfonate | 80 | Methanesulfonic acid | 150 | 12 | 50:50 | 10 | 0.1 | MeOH | 5.0 |
| Example 3 | Stannous methanesulfonate | 80 | Methanesulfonic acid | 150 | 12 | 50:50 | 20 | 0.2 | MeOH | 10.0 |
| Example 4 | Stannous methanesulfonate | 80 | Methanesulfonic acid | 150 | 12 | 50:50 | 1 | 0.1 | MeOH | 5.0 |
| Example 5 | Stannous methanesulfonate | 80 | Methanesulfonic acid | 150 | 12 | 50:50 | 20 | 0.1 | MeOH | 5.0 |
| Example 6 | Stannous methanesulfonate | 80 | Methanesulfonic acid | 150 | 12 | 50:50 | 10 | 0.1 | MeOH | 5.0 |
| | Silver methanesulfonate | 1 | | | | | | | | |
| | Copper methanesulfonate | 0.5 | | | | | | | | |
| Example 7 | Stannous methanesulfonate | 80 | Methanesulfonic acid | 150 | 5 | 50:50 | 10 | 0.1 | MeOH | 5.0 |
| Example 8 | Stannous methanesulfonate | 80 | Methanesulfonic acid | 150 | 20 | 50:50 | 10 | 0.1 | MeOH | 5.0 |
| Example 9 | Stannous methanesulfonate | 80 | Methanesulfonic acid | 150 | 12 | 30:70 | 10 | 0.1 | MeOH | 5.0 |

TABLE 1-continued

Kinds and blended amounts of components of plating solution

| | Metallic salt A | | Acid B | | Surfactant C | | | Benzal-acetone D | Solvent E | |
|---|---|---|---|---|---|---|---|---|---|---|
| | Kind | (g/L) | Kind | (g/L) | R: Number of carbon atoms | EO:PO | (g/L) | (g/L) | Kind | (g/L) |
| Example 10 | Stannous methanesulfonate | 80 | Methanesulfonic acid | 150 | 12 | 70:30 | 10 | 0.1 | MeOH | 5.0 |
| Example 11 | Stannous methanesulfonate | 80 | Methanesulfonic acid | 150 | 12 | 50:50 | 10 | 0.1 | IPA | 10.0 |

TABLE 2

Kinds and blended amounts of components of plating solution

| | Metallic salt A | | Acid B | | Surfactant C | | Benzal-acetone D | Solvent E | |
|---|---|---|---|---|---|---|---|---|---|
| | Kind | (g/L) | Kind | (g/L) | Kind | (g/L) | (g/L) | Kind | (g/L) |
| Example 12 | Stannous methanesulfonate | 80 | Methanesulfonic acid | 150 | Polyoxyethylene phenyl ether | 5 | 0.1 | MeOH | 5.0 |
| Example 13 | Stannous methanesulfonate Silver methanesulfonate | 80 1 | Methanesulfonic acid | 150 | Polyoxyethylene nonylphenyl ether | 10 | 0.1 | IPA | 5.0 |
| Example 14 | Stannous methanesulfonate | 80 | Methanesulfonic acid | 150 | Polyoxyethylene distyrenated phenyl ether | 15 | 0.1 | IPA | 5.0 |
| Example 15 | Stannous methanesulfonate | 80 | Methanesulfonic acid | 150 | Polyoxyethylene β-naphthyl ether | 5 | 0.05 | IPA | 5.0 |
| Example 16 | Stannous methanesulfonate | 80 | Methanesulfonic acid | 150 | Polyoxyethylene bisphenol A ether | 10 | 0.1 | IPA | 5.0 |
| Example 17 | Stannous methanesulfonate | 80 | Methanesulfonic acid | 150 | Polyoxyethylene cumylphenyl ether | 20 | 0.1 | IPA | 5.0 |

TABLE 3

Kinds and blended amounts of components of plating solution

| | Metallic salt A | | Acid B | | Surfactant C | | | Benzal-acetone D | Solvent E | |
|---|---|---|---|---|---|---|---|---|---|---|
| | Kind | (g/L) | Kind | (g/L) | R: Number of carbon atoms | EO:PO | (g/L) | (g/L) | Kind | (g/L) |
| Comparative Example 1 | Stannous methanesulfonate | 80 | Methanesulfonic acid | 150 | 12 | 50:50 | 1 | 0.01 | MeOH | 0.5 |
| Comparative Example 2 | Stannous methanesulfonate | 80 | Methanesulfonic acid | 150 | 12 | 50:50 | 30 | 0.3 | MeOH | 15.0 |
| Comparative Example 3 | Stannous methanesulfonate | 80 | Methanesulfonic acid | 150 | 12 | 50:50 | 1 | 0.2 | MeOH | 10.0 |
| Comparative Example 4 | Stannous methanesulfonate | 80 | Methanesulfonic acid | 150 | 12 | 50:50 | 25 | 0.1 | MeOH | 5.0 |
| Comparative Example 5 | Stannous methanesulfonate | 80 | Methanesulfonic acid | 150 | 12 | 50:50 | 5 | 0.05 | MeOH | 0.25 |

TABLE 4

| | C/D | E/D | Height variation after reflow (%) | Appearance of plated film |
|---|---|---|---|---|
| Example 1 | 100 | 10 | 3.1 | Favorable |
| Example 2 | 100 | 50 | 1.8 | Favorable |
| Example 3 | 100 | 50 | 6.1 | Favorable |
| Example 4 | 10 | 50 | 7.1 | Permissible |

TABLE 4-continued

|  | C/D | E/D | Height variation after reflow (%) | Appearance of plated film |
|---|---|---|---|---|
| Example 5 | 200 | 50 | 4.7 | Permissible |
| Example 6 | 100 | 50 | 3.4 | Favorable |
| Example 7 | 100 | 50 | 6.1 | Favorable |
| Example 8 | 100 | 50 | 8.6 | Favorable |
| Example 9 | 100 | 50 | 5.1 | Favorable |
| Example 10 | 100 | 50 | 3.3 | Favorable |
| Example 11 | 100 | 100 | 2.5 | Favorable |
| Example 12 | 50 | 50 | 3.5 | Permissible |
| Example 13 | 100 | 50 | 4.1 | Favorable |
| Example 14 | 150 | 50 | 2.8 | Favorable |
| Example 15 | 100 | 100 | 7.2 | Permissible |
| Example 16 | 100 | 50 | 5.5 | Favorable |
| Example 17 | 200 | 50 | 5.6 | Favorable |
| Comparative Example 1 | 100 | 50 | 16.2 | Permissible |
| Comparative Example 2 | 100 | 50 | 7.1 | Poor |
| Comparative Example 3 | 5 | 50 | 12.8 | Permissible |
| Comparative Example 4 | 250 | 50 | 21.5 | Permissible |
| Comparative Example 5 | 100 | 5 | Not evaluable | Not evaluable |

Examples 2 to 17 and Comparative Examples 1 to 5

The kinds and blended amounts of the components (A) to (E) in plating solutions of Examples 2 to 11 and Comparative Examples 1 to 5 were changed as shown in Tables 1 and 3, and the mass ratios (C/D) and the mass ratios (E/D) were changed as shown in Table 4. Except for the above-described changes, the plating solutions were prepared in electrolytic baths in the same manner as in Example 1. In Example 6, a SnAgCu plating solution was prepared in an electrolytic bath using stannous methanesulfonate, silver methanesulfonate, and copper methanesulfonate as soluble salts.

The kinds and blended amounts of the components (A) to (E) in plating solutions of Examples 12 to 17 were changed as shown in Table 2, and the mass ratios (C/D) and the mass ratios (E/D) were changed as shown in Table 4. Except for the above-described changes, the plating solutions were prepared in electrolytic baths in the same manner as in Example 1. In Examples 12 to 17, surfactants (C) shown in Table 2 were used. In Example 13, a SnAg plating solution was prepared in an electrolytic bath using stannous methanesulfonate and silver methanesulfonate as soluble salts.

In Table 1 to 3, "MeOH" indicates methanol, and "IPA" indicates isopropyl alcohol.

<Comparative Test and Evaluation>

As shown in FIG. 1(a) to FIG. 1(c), 22 silicon wafers were subjected to electroplating using 22 kinds of the plating solutions prepared in the electrolytic baths of Examples 1 to 17 and Comparative Examples 1 to 5 under conditions where a liquid temperature was 25° C. and a current density was 4 A/dm$^2$. Thereby, plated films were formed on foundation layers inside small-diameter vias and large-diameter vias each having a circular shape in an upper surface view. After that, resist layers, copper seed layers, and titanium layers were sequentially removed. Subsequently, remaining plated films were melted by a reflow treatment at 240° C. in a nitrogen atmosphere. Thereby, 2,000 small-diameter bumps having a diameter of approximately 20 μm were formed, and 2,000 large-diameter bumps having a diameter of approximately 60 μm were formed. (1) The height variation (uniformity) among the bumps after the reflow treatment and (2) the appearance of the plated film on the bump surface were evaluated using the following methods. The results are shown in Table 4.

(1) Height Variation Among Bumps (Uniformity)

A distance from a surface of the foundation layer to a top portion of the dome-shaped bump was regarded as the height of the bump after the reflow treatment. For a total of 4,000 bumps that were 2,000 small-diameter bumps and 2,000 large-diameter bumps, the heights of the respective bumps were measured using a laser microscope. The average value, the maximum value, and the minimum value of the heights of the 4,000 bumps were obtained, and the height variation among the bumps were computed using the following expression.

Bump height variation (%)={(maximum value−minimum value)/average value}×100

(2) Appearance of Plated Film on Bump Surface

The 22 kinds of tin or tin alloy plating solutions prepared in the electrolytic baths each were separately put into a Hull cell manufactured by Yamamoto-MS Co., Ltd. In the solution, a copper Hull cell plate was disposed as a cathode, a platinum plate was disposed as an anode, and a Hull cell test was carried out. As plating conditions, the liquid temperature was set to 25° C., the energization current was set to 3 A, and the plating treatment time was set to five minutes. During a plating treatment, the plating solution was stirred using a cathode rocker. Hull cell evaluation was carried out in the following order. The film appearance of the plated film on the plated Hull cell plate was visually confirmed using a cathode current density scale. A glossy or semi-glossy film was evaluated as "favorable (good)". A non-glossy or blurred film was evaluated as "permissible (fair)". A burnt and charred film was evaluated as "poor". Evaluation was carried out using the above-described three evaluation standards.

As is clear from Table 4, in Comparative Example 1, the appearance of the plated film was "permissible". However, the amount of the benzalacetone in the plating solution was 0.01 g/L, which was too small, and thus the height variation among the bumps after the reflow treatment was 16.2% which was large, and the height uniformity of the bumps was poor.

In Comparative Example 2, the height variation among the bumps after the reflow treatment was 7.1% which was small, and the heights of the bumps were uniform. However, the amount of the benzalacetone in the plating solution was 0.3 g/L, which was excessive, and thus the appearance of the plated film was "poor".

In Comparative Example 3, the appearance of the plated film was "permissible". However, the mass ratio (C/D) of the surfactant (C) to the benzalacetone (D) was 5, which was too small, and thus the height variation among the bumps after the reflow treatment was 12.8% which was large, and the height uniformity of the bumps was poor.

In Comparative Example 4, the appearance of the plated film was "permissible". However, the mass ratio (C/D) of the surfactant (C) to the benzalacetone (D) was 250, which was too great, and thus the height variation among the bumps after the reflow treatment was 21.5% which was large, and the height uniformity of the bumps was poor.

In Comparative Example 5, the mass ratio (E/D) of the solvent (E) to the benzalacetone (D) was 5, which was too small, and thus the benzalacetone did not dissolve in methanol which was the solvent. Therefore, neither the height variation among the bumps after the reflow treatment nor the appearance of the plated film could be evaluated.

In contrast, as is clear from Table 4, in Examples 1 to 17, the amount of the benzalacetone (D), the mass ratio (C/D) of the surfactant (C) to the benzalacetone (D), and the mass ratio (E/D) of the solvent (E) to the benzalacetone (D) all satisfied the requirements of the present embodiment. Therefore, the height variations among the bumps after the reflow treatment were in a range of 1.8 to 8.6 which were small, and, the appearances of the plated films were "favorable" or "permissible".

INDUSTRIAL APPLICABILITY

The tin or tin alloy plating solution of the present embodiment can be used for circuit boards such as a semiconductor substrate, a printed circuit board, a flexible printed circuit board, and a semiconductor integrated circuit.

EXPLANATION OF REFERENCE SIGNS

11 Base material
12 Titanium layer
13 Copper seed layer
14 Resist layer
14a, 14b Via
15 Resist pattern
16 Foundation layer
17a, 17b Tin or tin alloy plated-deposited layer (tin or tin alloy plated film)
18a, 18b Tin bump

The invention claimed is:
1. A tin or tin alloy plating solution comprising:
a soluble salt including at least a stannous salt (A);
an acid selected from an organic acid and an inorganic acid or a salt thereof (B);
a surfactant (C);
benzalacetone (D); and
a solvent (E),
wherein the plating solution is used to form a pattern in which bump diameters are different from each other on a base material,
the benzalacetone (D) is included in the plating solution in an amount of 0.1 g/L to 0.2 g/L,
the solvent (E) is included in the plating solution in an amount of 5 g/L to 10 g/L,
a mass ratio (C/D) of the surfactant (C) to the benzalacetone (D) is 50 to 200,
a mass ratio (E/D) of the solvent (E) to the benzalacetone (D) is 50 to 100,
the surfactant (C) is a nonionic surfactant obtained by condensing polyoxyethylene (EO) and polyoxypropylene (PO), and
the nonionic surfactant has polyalkylene oxide groups each independently including an ethylene oxide group (EO group) and a propylene oxide group (PO group) in a range of 30:70 to 70:30 in terms of a molar ratio (EO group:PO group).
2. A method for forming bumps, the method comprising:
a step of forming a plurality of tin or tin-alloy plated-deposited layers having different diameters on a base material using the tin or tin-alloy plating solution according to claim 1; and
a subsequent step of carrying out a reflow treatment to form a plurality of bumps having different bump diameters.

* * * * *